(12) United States Patent  
Kitamura

(10) Patent No.: US 6,687,140 B2
(45) Date of Patent: Feb. 3, 2004

(54) DISCONNECTION DETECTING CIRCUIT DETECTING DISCONNECTION BASED ON A CHANGE IN DETECTION SIGNAL

(75) Inventor: Fumihide Kitamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/211,305

(22) Filed: Aug. 5, 2002

(65) Prior Publication Data

US 2003/0151934 A1 Aug. 14, 2003

(30) Foreign Application Priority Data

Feb. 14, 2002 (JP) ........................................ 2002-037197

(51) Int. Cl.$^7$ ................................................ H02H 7/10
(52) U.S. Cl. ........................................................ 363/50
(58) Field of Search ...................... 363/50, 55; 714/2–5, 714/10, 14, 42–44

(56) References Cited

U.S. PATENT DOCUMENTS 5,416,836 A * 5/1995 Marinelli et al. ........... 379/377
5,942,677 A * 8/1999 Vulih et al. ................. 73/35.03

FOREIGN PATENT DOCUMENTS

| JP | 61-3073 | 1/1986 |
| JP | 62-232578 | 10/1987 |
| JP | 3-96873 | 4/1991 |

* cited by examiner

Primary Examiner—Matthew V. Nguyen
(74) Attorney, Agent, or Firm—Burns, Doane, Swecker & Mathis, LLP

(57) ABSTRACT

A disconnection detecting circuit includes switches for setting a detection signal to be supplied for a signal line, a resistor for supplying the signal line with the detection signal set by the switches and control means for controlling the switches to set the detection signal to be supplied for the signal line and judging whether there is disconnection or not in the signal line on the basis of a change in the detection signal.

6 Claims, 5 Drawing Sheets

RESISTANCE VALUE: R2 << R1

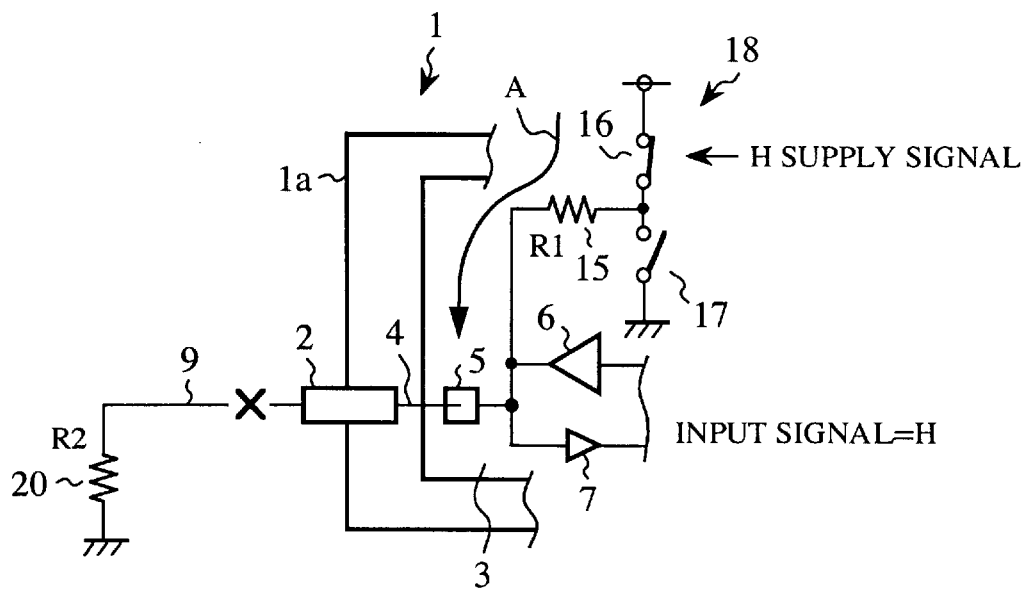
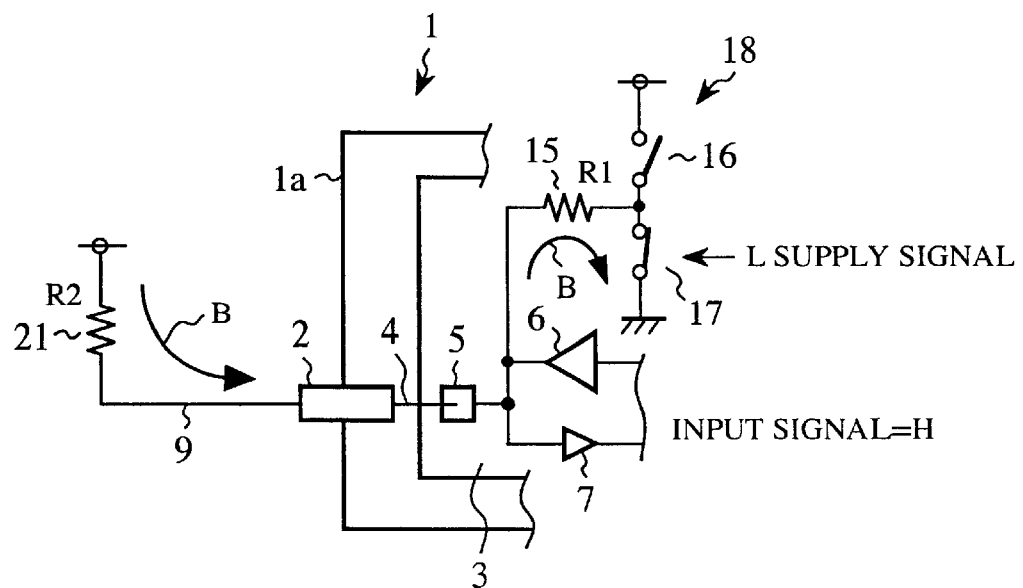

DISCONNECTION DETECTING CIRCUIT DETECTING DISCONNECTION BASED ON A CHANGE IN DETECTION SIGNAL

BACKGROUND OF THE INVENTION

1. Field of the Invention

The present invention relates to a disconnection detecting circuit which judges whether there is a disconnection or not in a signal line connecting a micro processor and an IC or a sensor which are used with high reliability at the same time in environments accompanied by vibration, such as in planes and automobiles.

2. Description of Related Art

FIG. 10 is an explanatory diagram to show one example of a conventional disconnection detecting circuit. Reference numeral 1 denotes a device having a disconnection detecting circuit, such as a micro processor, reference sign 1a denotes a body of the device 1, i.e., IC package, reference numeral 2 denotes a lead member provided in the IC package 1a, reference numeral 3 denotes an IC chip on which an integrated circuit is formed, reference numeral 4 denotes a bonding wire for connecting the lead member 2 and the IC chip 3, reference numeral 5 denotes a bonding pad connected to the lead member 2 with the bonding wire 4, reference numeral 6 denotes an output buffer which is a constituent of the integrated circuit formed on the IC chip 3, reference numeral 7 denotes an input buffer which is a constituent of the integrated circuit formed on the IC chip 3, reference numeral 8 denotes a peripheral device such as an integrated circuit device (hereinafter referred to as "IC") or a sensor, which is connected to the device 1 and reference numeral 9 denotes a signal line for connecting the device 1 and the peripheral device 8.

Next, an operation of the disconnection detecting circuit will be discussed.

Discussion will be made on a disconnection detecting circuit in which the device 1 and the peripheral device 8 are connected with the signal line 9 as an exemplary conventional one. In advance a predetermined signal or signal level is set in the peripheral device 8 as an expected value. The peripheral device 8 outputs the expected value signal to the signal line 9 like an ordinary transmit data, to transmit it to the device 1. The device 1 judges whether the received expected value signal coincides with the signal or signal level set in advance or not, for judgment on whether there is a disconnection or not in the signal line 9.

FIG. 11 is an explanatory diagram to show another example of conventional disconnection detecting circuit. The disconnection detecting circuit shown in FIG. 11 is intended for judgment on whether there is a disconnection or not in the signal line 9 without outputting the expected value signal from the peripheral device 8, and constituent elements thereof identical to or corresponding to those of the disconnection detecting circuit of FIG. 10 are denoted by the same reference signs and further description thereon will be omitted. In FIG. 11, reference numeral 10 denotes a resistor loaded on the signal line 9 and reference numeral 11 denotes wiring capacitance generated in the signal line 9 which connects the peripheral device 8 and the device 1.

Next, an operation of the disconnection detecting circuit will be discussed.

The disconnection detecting circuit shown in FIG. 11 detects disconnection by accumulating electric charges in the following procedure. To begin with, a predetermined signal is temporarily output from the output buffer 6 of the device 1 to the signal line 9. Then, the electric charges are accumulated in the wiring capacitance 11 of the signal line 9. After that, the output of the output buffer 6 is stopped and a given period later, the signal input to the device 1 through the lead member 2 is observed. From this observation result, it is judged whether there is a disconnection or not as follows. The observation is made on the output side of the input buffer 7.

1. When a signal of high level (hereinafter referred to as "H") is temporarily output from the output buffer 6 and H electric charges are accumulated in the wiring capacitance 11, judgment is made as follows:
   i) If the output of the input buffer is H, there is a possibility of disconnection.
   ii) If the output of the input buffer is low level (hereinafter referred to as "L"), there is no possibility of disconnection.

This judgment on whether there is a disconnection or not, is made from a fact that if a terminal voltage of the peripheral device 8 connected to the signal line 9 is L, when an H signal is output from the output buffer 6 of the device 1 to the signal line 9 for a given period and stopped, the potential of the signal line 9 falls from H level and converges on the terminal voltage of the peripheral device 8.

2. When an L signal is temporarily output from the output buffer 6 and L electric charges are accumulated in the wiring capacitance 11, judgment is made as follows:
   i) If the output of the input buffer is H, there is no possibility of disconnection.
   ii) If the output of the input buffer is L, there is a possibility of disconnection.

This judgment on whether there is a disconnection or not, is made from a fact that if the terminal voltage of the peripheral device 8 connected to the signal line 9 is H, when an L signal is output from the output buffer 6 of the device 1 to the signal line 9 for a given period and stopped, the potential of the signal line 9 rises from L level and converges on the terminal voltage of the peripheral device 8.

When it can be judged that there is a possibility of disconnection in both cases of the above items 1 and 2, it is supposed that disconnection occurs between the resistor 10 and the device 1. Further, when it is judged that there is no possibility of disconnection in either case of the above item 1 or 2, it can be judged that disconnection does not occur between the resistor 10 and the device 1.

That is, if the electric charges output from the output buffer 6 are accumulated in the wiring capacitance 11 for a longer time than a predetermined period, it is judged that disconnection occurs in the signal line 9 and if the electric charges accumulated in the wiring capacitance 11 are not detected at the output of the input buffer 7 by a drive of the peripheral device 8 connected to the device 1 through the resistor 10 in either item 1 or 2, it is judged that the signal line is normally connected. Further, when the output of the input buffer 7 is read, the output of the output buffer 6 should be brought into a high impedance state so that it does not affect data to be measured which are output from the peripheral device 8.

Since the conventional disconnection detecting circuit has the above constitution, it is possible to perform a relatively easy detection of disconnection in the signal line or the like when the peripheral device has a function of outputting the expected value signal set in advance. However, when the peripheral device has no function of outputting the expected value signal, the resistor is inserted in the signal line as shown in FIG. 11 and it is indirectly judged whether disconnection occurs in the signal line, using the characteristics that the wiring capacitance holds the electric charges for a given period. In this case, the time period while the electric charges are accumulated in the wiring capacitance and the length of time until the electric charges accumulated in the wiring capacitance are observed are closely related to a lot of factors, such as the resistance value of the resistor, the output characteristics of the peripheral device, the value of the wiring capacitance and the characteristics of the output buffer and the input buffer provided in the device, and they can not be uniquely determined. This causes a problem that the resistance value of the resistor, the output time of the output buffer and the length of time until the electric charges accumulated in the wiring capacitance are observed should be determined, with repeated trial and error after the circuit employing the device and the peripheral device are completed.

SUMMARY OF THE INVENTION

The present invention is intended to solve the above described problems and it is an object of the present invention to provide a disconnection detecting circuit capable of detecting disconnection in a signal line by a static measurement without inserting electronic components such as a resistor or the like in the signal line or without relation to an amount of the wiring capacitance, the resistance value of wires, the output characteristics of the peripheral device or the characteristics of the output buffer provided in the device even if the peripheral device has no function of outputting the expected value signal.

It is another object of the present invention is to provide a disconnection detecting circuit capable of judging whether there is a disconnection or not in a wire between the peripheral device and a lead member serving as an input terminal of the device and, in addition, in a bonding wire connecting between a bonding pad to the lead member in the device and whether there is a poor connection or not in the connecting portion thereof.

A disconnection detecting circuit according to the present invention includes a switch for setting a detection signal to be supplied for the signal line, a resistor for supplying the signal line with the detection signal set by the switch, and control means for controlling the switch to set the detection signal to be supplied for the signal line and judging whether there is a disconnection or not in the signal line on the basis of a change in the detection signal, which are provided in the device.

Therefore, the disconnection detecting circuit according to the present invention can produce an effect of detecting disconnection in a short time with a simple constitution.

BRIEF DESCRIPTION OF THE DRAWINGS

FIGS. 2 to 9 are explanatory diagrams to show the operation of the disconnection detecting circuit in accordance with the first preferred embodiment of the present invention;

DETAILED DESCRIPTION OF THE PREFERRED EMBODIMENTS

Now, a preferred embodiment of the present invention will be discussed.

The First Preferred Embodiment

Figure 1:
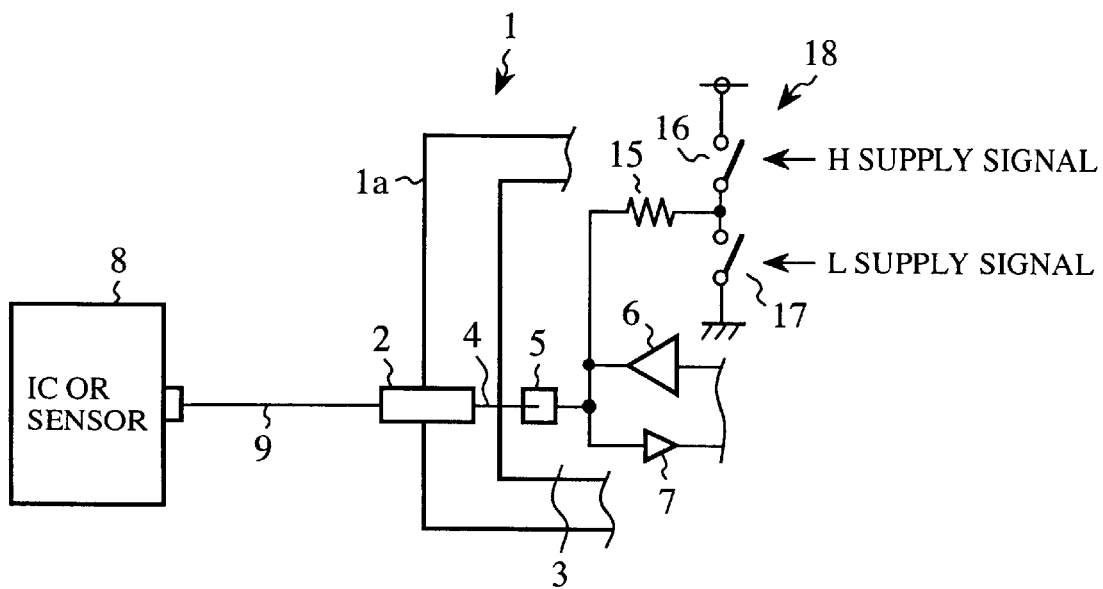
FIG. 1 is an explanatory diagram to show a disconnection detecting circuit in accordance with a first preferred embodiment of the present invention.

FIG. 1 is an explanatory diagram to show a disconnection detecting circuit in accordance with the first preferred embodiment of the present invention. The disconnection detecting circuit is provided within an integrated circuit device (hereinafter referred to as "IC") such as a micro processor. In FIG. 1, reference numeral 1 denotes a device having the disconnection detecting circuit, such as a micro processor, reference sign 1a denotes a body of the device 1, i.e., IC package, reference numeral 2 denotes a lead member provided in the IC package 1a. Reference numeral 3 denotes an IC chip (chip) provided within the IC package, on which an integrated circuit is formed, reference numeral 4 denotes a bonding wire (connecting portion) for connecting the lead member 2 and the IC chip 3, reference numeral 5 denotes a bonding pad (connecting portion) connected to the lead member 2 with the bonding wire 4, reference numeral 6 denotes an output buffer which is a constituent of the integrated circuit formed on the IC chip 3, reference numeral 7 denotes an input buffer which is a constituent of the integrated circuit formed on the IC chip 3, reference numeral 8 denotes a peripheral device such as an IC, a sensor or the like, which is connected to the device 1, reference numeral 9 denotes a signal line for connecting the device 1 and the peripheral device 8, reference numeral 15 denotes a resistor, reference numeral 16 denotes a switch (open/close switch) for turning on/off a connection between the resistor 15 and a power supply or the like, reference numeral 17 denotes a switch (open/close switch) for turning on/off a connection between the resistor 15 and a ground and reference numeral 18 denotes a disconnection detecting circuit which detects whether there is a disconnection in the signal line 9 by supplying a potential of high level (hereinafter referred "H") or that of low level (hereinafter referred to as "L") for the bonding pad 5.

In the first preferred embodiment, whether there is a disconnection or not or whether connection is good or bad in the signal line 9 or the bonding wire 4 and the like in the device 1 is detected by using the disconnection detecting circuit 18 provided in the device 1 itself in a state where the lead member 2 of the device 1 such as a micro processor is connected to the signal line 9, i.e., where the device 1 is connected to the peripheral device 8. The disconnection detecting circuit 18 comprises the switches 16 and 17 of ON/OFF open/close system, for example, consisting of transistor switches, and further comprises the resistor 15 connected to the switches 16 and 17, and control means (not shown) for judging whether there is a disconnection or not in the signal line 9 by monitoring outputs of the input buffer 7. Furthermore, a control means or the like in the device 1 serves as the above mentioned control means, and the present invention is intended for detection on whether there is a disconnection or not in the signal line 9 to which the device 1 such as a micro processor is connected itself without providing any additional components outside.

In the disconnection detecting circuit 18, one of connection terminals of the switch 16 is connected to the power supply or the like to which an H potential is supplied and the other connection terminal is connected to an connection terminal of the switch 17 as shown in FIG. 1. Further, the other connection terminal of the switch 17 is connected to the ground to which an L potential is supplied. One end of the resistor 15 is connected to a connecting portion between the switches 16 and 17. The other end of the resistor 15 is connected to the bonding pad 5 and an input port of a circuit which is a constituent of the device 1, such as the input side of the input buffer 7, or an I/O port.

The bonding pad 5, the output buffer 6 and the input buffer 7 constituting the integrated circuit of the device 1 are formed on the IC chip 3 and the disconnection detecting circuit 18 is also formed on the IC chip 3 as a part of the integrated circuit. Further, the disconnection detecting circuit 18 is not necessarily formed on the same chip only if it can produce the same action and effect. The bonding wire 4 is connected to the bonding pad 5 provided on the IC chip 3 and the bonding pad 5 is connected to the lead member 2 with this bonding wire 4. The lead member 2 protrudes outside the IC package 1a, and it is a portion for example, for soldering onto the pad formed on a substrate, or for making contact with a connector of a socket when the device 1 is inserted into the socket. The device 1 is connected to the signal line 9 using the lead member 2.

Next, an operation of the disconnection detecting circuit will be discussed.

When the disconnection detecting circuit 18 performs detection of disconnection, either one of the switches 16 and 17 is closed and the other is opened, and when the disconnection detecting circuit 18 does not perform detection of disconnection, both the switches 16 and 17 are opened. Further, the control means provided in the device 1 performs setting and control of ON/OFF of the switches 16 and 17 and judgment on whether there is a disconnection in the signal line 9 on the basis of the output of the input buffer 7.

Figure 2:
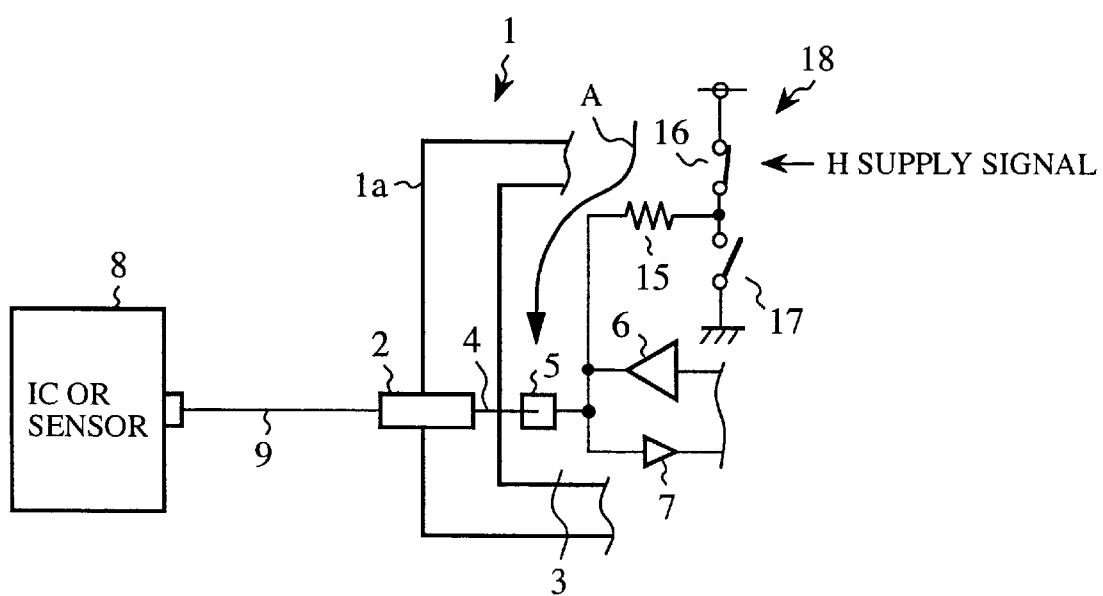
Figure 3:
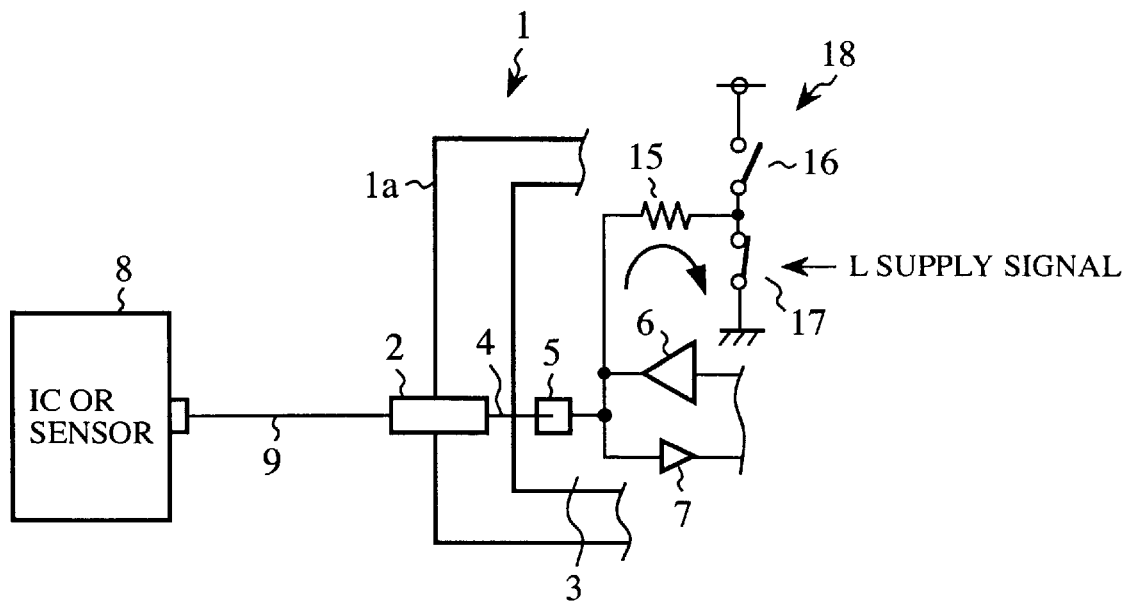

FIGS. 2 to 9 are explanatory diagrams to show the operation of the disconnection detecting circuit 18 in accordance with the first preferred embodiment of the present invention. Constituent elements identical to those in the disconnection detecting circuit 18 shown in FIG. 1 are denoted by the same reference signs and further description thereon will be omitted. FIG. 2 shows a state where the switch 16 is closed to supply the bonding pad 5 with an H supply signal. FIG. 3 shows a state where the switch 17 is closed to supply the bonding pad 5 with an L supply signal.

Figure 4:
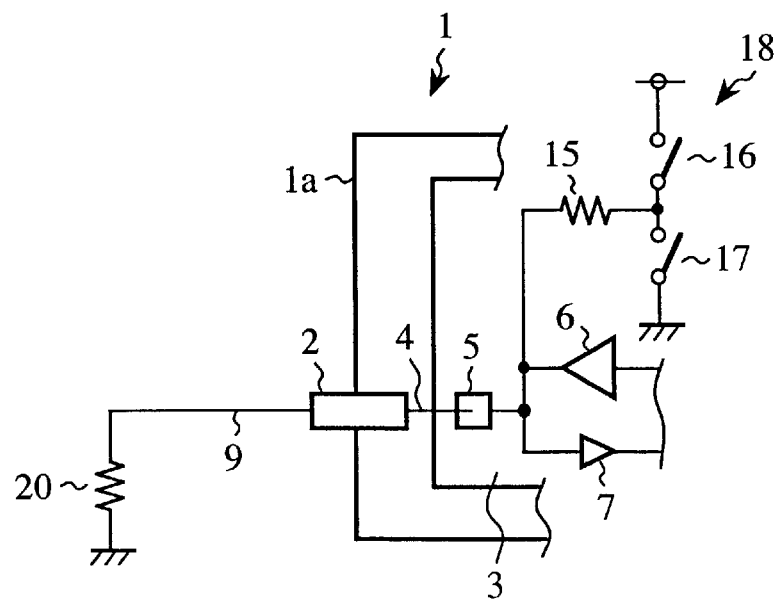

FIG. 4 shows an equivalent circuit of the state shown in FIG. 2 and the peripheral device 8 of FIG. 2 is equivalently represented by a resistor 20 in FIG. 4. The resistor 20 has two ends, one of which is connected to the signal line 9 and the other is connected to the ground. When the switch 16 of FIG. 2 is in an ON state, the H supply signal supplied from the power supply or the like is supplied to the input side of the input buffer 7, i.e., the bonding pad 5 through the resistor 15, further transmitted to the lead member 2 through the bonding wire 4, and supplied to the peripheral device 8 through the signal line 9.

Figure 5:
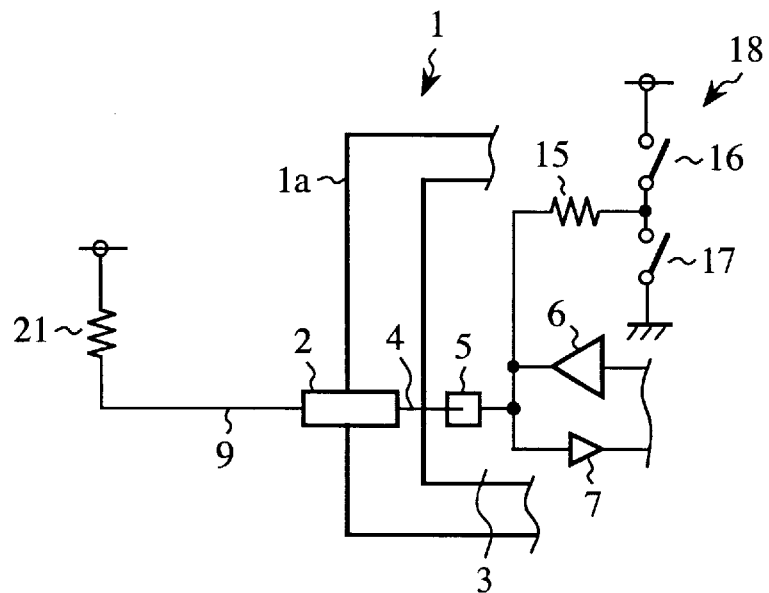

Furthermore, FIG. 5 shows an equivalent circuit of the state shown in FIG. 3 and the peripheral device 8 of FIG. 3 is equivalently represented by a resistor 21 of FIG. 5. The resistor 21 has two ends, one of which is connected to the signal line 9 and the other is connected to the power supply or the like, to which the H potential is applied. When the switch 17 of FIG. 3 is in an ON state, since the ground and the resistor 15 are connected, the L supply signal is supplied to the input side of the input buffer 7, i.e., the bonding pad 5 through the resistor 15, further transmitted to the lead member 2 through the bonding wire 4, and supplied to the peripheral device 8 through the signal line 9.

Figure 6:
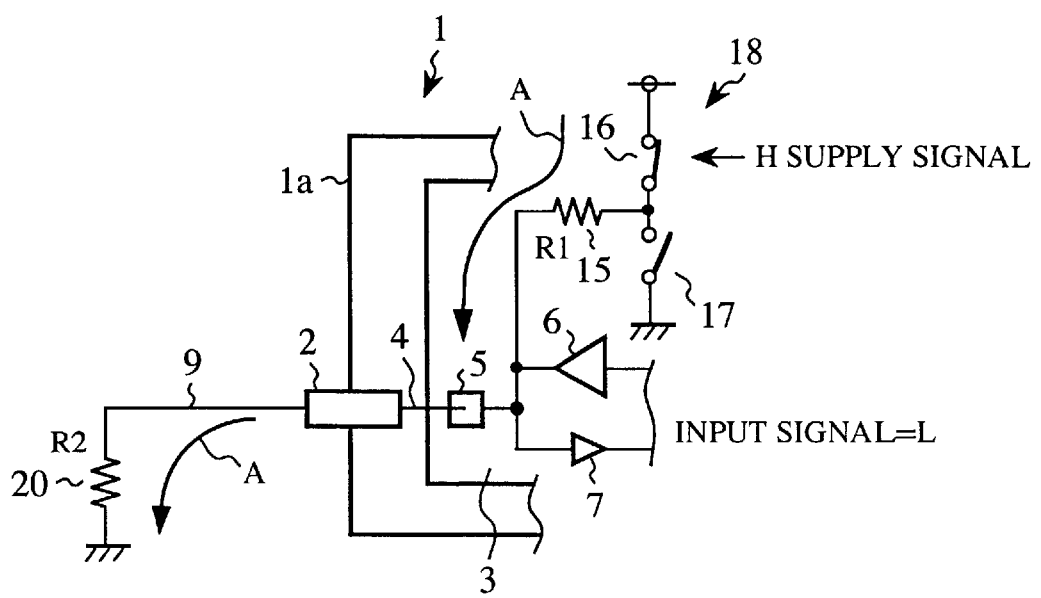

Detection of disconnection in the case where the terminal voltage of the peripheral device 8 connected to the signal line 9 is relatively low as shown in FIGS. 2 and 4, will be discussed. In such a case, when the signal line 9 is supplied with the L supply signal, since an L potential is applied to both ends of the signal line 9 and no current flows in the signal line 9, it is impossible to detect whether there is a disconnection or not. In this case, the control means of the disconnection detecting circuit 18 supplies the signal line 9 with the H supply signal, carrying currents from the side of the device 1 to the side of the peripheral device 8, to detect whether there is a disconnection in the signal line 9. The detection of disconnection in this case will be discussed with reference to FIGS. 6 and 7. In FIGS. 6 and 7, it is supposed that the resistance value of the resistor 15 is R1, that of the resistor 20 is R2 and the value R1 is sufficiently larger than the value R2 (R1>>R2).

As shown in FIG. 6, when the control means turns the switch 16 to the ON state, the H potential, i.e., the H supply signal is supplied to the bonding pad 5 and a current A flows from the resistor 15 into the signal line 9 through the bonding pad 5, the bonding wire 4 and the lead member 2. If there is no disconnection in the signal line 9, the current A flows into the resistor 20 whose one end is connected to the ground through the signal line 9. When the current A thus flows in, since the value R2 of the resistor 20 is sufficiently smaller than the value R1 of the resistor 15, the potential of the H supply signal supplied to the signal line 9 is drawn by the resistor 20 and the potential of the signal line 9 becomes L. Then, the L potential which is equivalent to the potential of the signal line 9 is applied to the lead member 2 and an input signal of L potential is input to the input buffer 7.

The control means which monitors the output of the input buffer 7 detects that the potential of the signal line 9, i.e., the potential of the H supply signal converges on the potential of the terminal voltage of the peripheral device 8, i.e., the L potential, from a fact that the L potential is detected at the output of the input buffer 7 when the signal line 9 is supplied with the H supply signal, and judges that there is no disconnection in the signal line 9.

Further, when there is a disconnection in the signal line 9, since no current A flows into the resistor 20 through the signal line 9 supplied with the H supply signal as shown in FIG. 7, the potential of the H supply signal is applied to the input side of the input buffer 7 without being drawn to the ground through the resistor 20, and a signal corresponding to the input signal of H potential is output from the input buffer 7. The control means which detects the H potential from the input buffer 7 judges that there is a disconnection in the signal line 9 from a fact that the H potential is detected at the input buffer 7 when the signal line 9 is supplied with the H supply signal.

Figure 9:
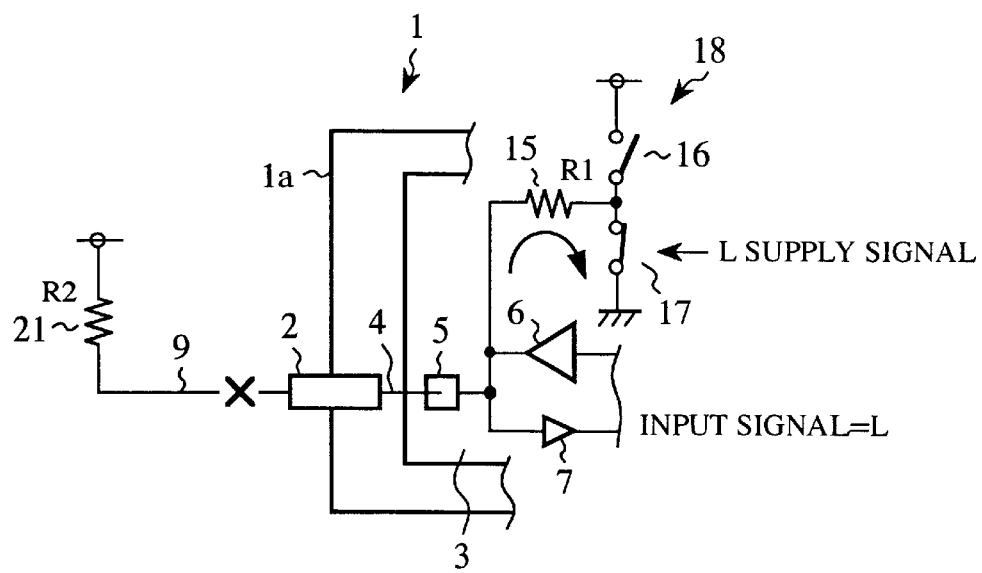
Figure 10:
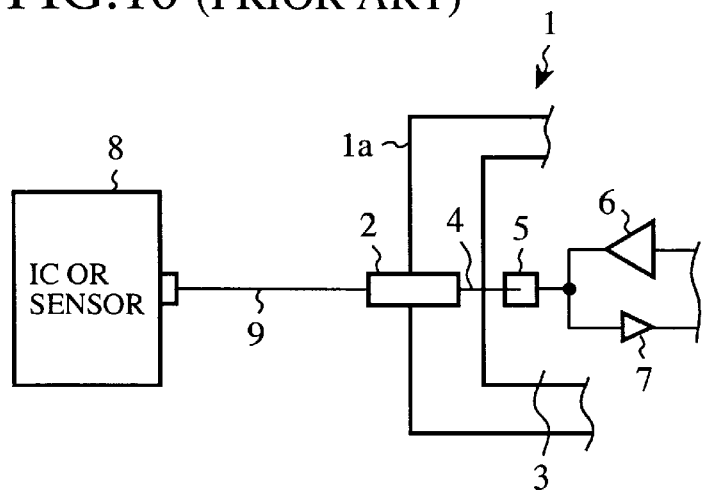
FIG. 10 is an explanatory diagram to show one example of a conventional disconnection detecting circuit.
Figure 11:
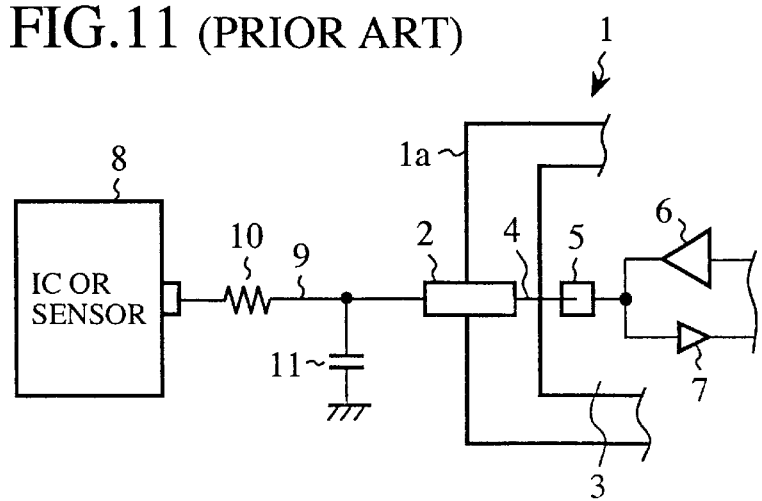
FIG. 11 is an explanatory diagram to show another example of a conventional disconnection detecting circuit.

Next, detection of disconnection in the case where the terminal voltage of the peripheral device 8 connected to the signal line 9 is relatively high as shown in FIGS. 3 and 5, will be discussed. In such a case, when the signal line 9 is supplied with the H supply signal, since the H potential is applied to both ends of the signal line 9 and the H potential is input to the input buffer 7 even if there is no disconnection in the signal line 9, the control means of the disconnection detecting circuit 18 misjudges that disconnection occurs. Therefore, the control means supplies the signal line 9 with the L supply signal, carrying currents from the side of the peripheral device 8 to the side of the device 1, to detect whether there is a disconnection or not in the signal line 9. The detection of disconnection in this case will be discussed with reference to FIGS. 8 and 9. In FIGS. 8 and 9, it is supposed that the resistance value of the resistor 15 is R1, that of the resistor 21 is R2 and the value R1 is sufficiently larger than the value R2 (R1>>R2).

As shown in FIG. 8, when the control means turns the switch 17 on, the resistor 15 is connected to the ground and the L supply signal is supplied to the bonding pad 5. Then, since the peripheral device 8, i.e., the resistor 21 supplies the signal line 9 with a higher potential than the L supply signal, a current B flows from the resistor 21 into the lead member 2, the bonding wire 4, the bonding pad 5 and the resistor 15 through the signal line 9. If there is no disconnection in the signal line 9, the current B flows into the resistor 15 whose one end is connected to the ground in an ON state of the switch 17. When the current B thus flows in, since the value R2 of the resistor 21 is sufficiently smaller than the value R1 of the resistor 15, the potential of the signal line 9 holds the H potential through the resistor 21 and the H input signal is input to the input buffer 7.

The control means which monitors the output of the input buffer 7 detects that the potential of the signal line 9, i.e., the potential of the L supply signal is changed to the potential of the terminal voltage of the peripheral device 8, i.e., the H potential supplied from the resistor 21 to the signal line 9, from a fact that the H potential is detected at the input buffer 7 when the signal line 9 is supplied with the L supply signal, and judges that there is no disconnection in the signal line 9.

Further, when there is a disconnection in the signal line 9, since no current B flows in the signal line 9 as shown in FIG. 9, not applying the H potential supplied from the resistor 21 to the signal line 9 to the input side of the input buffer 7, the input side of the input buffer 7 is supplied with the L potential of the L supply signal and a signal corresponding to the input signal is output from the input buffer 7. The control means which detects the L potential of the signal line 9 from the input buffer 7 judges that there is a disconnection in the signal line 9 from a fact that the L potential is detected at the input buffer 7 when the signal line 9 is supplied with the L supply signal.

Thus, the disconnection detecting circuit 18 provided within the device 1 detects disconnection in the signal line 9. Further, though the above discussion is made only about detection of disconnection in the signal line 9, the disconnection detecting circuit 18 can also detect whether there is a disconnection or not in the bonding wire 4 connected to the bonding pad 5 and whether connection between the bonding wire 4 and the bonding pad 5 or that between the bonding wire 4 and the lead member 2 are good or bad since the disconnection detecting circuit 18 supplies detection signals of the H supply signal and the L supply signal to the bonding pad 5, i.e., the input side of the input buffer 7. Furthermore, the disconnection detecting circuit 18 can also detect whether connection between the connecting portion in the substrate and the like to which the lead member of the device 1 is connected by soldering, and the lead member 2 of the device 1, is good or bad.

The lead member 2 of the device 1 shown in FIGS. 1 to 9 is a terminal of the device 1, which is taken as an exemplary terminal of an I/O port or the like for dealing I/O signals and which is positioned adjoining to the input buffer 7 and the output buffer 6. The disconnection detecting circuit 18 of the first preferred embodiment, which monitors the output of the input buffer 7 and detects whether there is the disconnection or not in the signal line 9 from this output, the disconnection detecting circuit 18 can be provided in an input port which has no output buffer 6. Further, the control means of the disconnection detecting circuit 18 may be so provided as to directly monitor the potential on the input side of the input buffer 7, i.e., that of the constituent such as the bonding pad 5, not the output of the input buffer 7, and in this case, the same action and effect can be achieved.

As described above, according to the first preferred embodiment, since the IC chip 3 comprises the disconnection detecting circuit 18, it is not necessary to load a resistor or the like on the signal line 9 and the potential of the signal line 9 becomes stable and thereby it is advantageously possible to stabilize the operation of the device 1, the peripheral device 8 and the like without any influence on signals which are transmitted through the signal line 9.

Further, since a static measurement can be performed by eliminating the necessity of accumulating electric charges in the wiring capacitance or the like of the signal line 9 and the detection of disconnection in the signal line 9 connected to the I/O terminals can be performed without switching the input and output of signals, it is possible to produce an effect of performing the detection of disconnection in a short time.

Furthermore, since the L supply signal or the H supply signal is output from the disconnection detecting circuit 18, it is advantageously possible to perform the detection of disconnection in whatever terminal voltage level of the peripheral device 8.

Since the detection of disconnection is performed by supplying the input port or the like such as the input side of the input buffer 7 with the L supply signal or the H supply signal and monitoring the output of the input buffer 7, it is advantageously possible to perform the detection of disconnection in the signal line 9 connected to the input port which has no output buffer 6.

Further, since the disconnection detecting circuit 18 comprises the switch 16 for switching ON/OFF of the H supply signal and the switch 17 for switching ON/OFF of the L supply signal, it is possible to produce an effect of avoiding any influence on signals transmitted on the signal line 9 by turning both the switches 16 and 17 off when the detection of disconnection is not performed.

Furthermore, since the detection of disconnection in the signal line 9 is performed by supplying the input side of the input buffer 7 or the like connected to the signal line 9 with the L supply signal or the H supply signal and monitoring the output side of the input buffer 7, the parameters affecting the detection of disconnection are only the resistance value R1 of the resistor 15 in the disconnection detecting circuit 18 and the resistance value R2 of the equivalent resistor 20 or 21 of the peripheral device 8, and therefore it is advantageously possible to provide the disconnection detecting circuit 18 which is capable of easily perform the detection of disconnection in the signal line 9.

Since the resistance value R1 of the resistor 15 in the disconnection detecting circuit 18 is efficiently larger than the resistance value R2 of the equivalent resistor 20 or 21 of the peripheral device 8, it is advantageously possible to perform the detection of disconnection without breaking or deteriorating the output buffer 6 of the device 1 and the output buffer of the peripheral device 8 and also use the disconnection detecting circuit 18 for the detection of disconnection in signal lines transmitting analog signals.

What is claimed is:

1. A disconnection detecting circuit for detecting disconnection of a signal line connecting a device and a peripheral device, comprising:

a switch for setting detection signal to be supplied for said signal line;

a resistor for supplying said signal line with a detection signal set by said switch; and a control means being provided in said device for controlling said switch to set said detection signal to be supplied for said signal line and judging whether there is disconnection or not in said signal line on the basis of a change in said detection signal, which are provided in said device.

2. The disconnection detecting circuit according to claim 1, wherein said switch switches said detection signal to potential of high level or that of low level which is determined by said control means, said resistor supplies said detection signal having said potential switched by said switch for a terminal of said device connected to said signal line, and said control means observes a change in potential of said detection signal supplied to said terminal of said device to judge whether there is disconnection or not in said signal line.

3. The disconnection detecting circuit according to claim 2, wherein said resistor has a resistance value sufficiently larger than a resistance value equivalent to said peripheral device, and said control means observes a change in potential of said signal line caused by a potential supplied from said resistor to said signal line and that supplied from said peripheral device to said signal line to judge whether there is disconnection or not in said signal line.

4. The disconnection detecting circuit according to claim 2, wherein said switch consists of an open/close switch for supplying or cutting out the detection signal having potential of high level and an open/close switch for supplying or cutting out a detection signal having potential of low level, and said control means opens said two open/close switches to open said signal line to be supplied with said detection signals when detection of disconnection is not performed.

5. The disconnection detecting circuit according to claim 1, wherein said device and said peripheral device are connected with the signal line formed on a substrate, and whether connection of a connecting portion between said signal line and said device is good or bad and whether connection of a connecting portion between said signal line and said peripheral device is good or bad are detected.

6. The disconnection detecting circuit according to claim 1, wherein said switch, said resistor and said control means are provided on a chip which is a constituent of said device, and whether connection of a connecting portion between a terminal of said device and said chip is good or bad is detected.

* * * * *